June 10, 1958

R. S. BRIGGS 2,838,712

TUNABLE MAGNETRON

Filed April 9, 1956

4 Sheets-Sheet 1

INVENTOR.
RICHARD S. BRIGGS

BY Edgar O. Rost

ATTORNEY.

TUNABLE MAGNETRON

Filed April 9, 1956 4 Sheets-Sheet 2

INVENTOR.
RICHARD S. BRIGGS

BY Edgar O. Rost

ATTORNEY.

June 10, 1958 R. S. BRIGGS 2,838,712

TUNABLE MAGNETRON

Filed April 9, 1956 4 Sheets-Sheet 3

INVENTOR.
RICHARD S. BRIGGS

BY Edgar O. Rost

ATTORNEY.

June 10, 1958 R. S. BRIGGS 2,838,712

TUNABLE MAGNETRON

Filed April 9, 1956 4 Sheets-Sheet 4

*INVENTOR.*
RICHARD S. BRIGGS

*BY* Edgar O. Rost

ATTORNEY

United States Patent Office 2,838,712
Patented June 10, 1958

2,838,712

TUNABLE MAGNETRON

Richard S. Briggs, Beverly, Mass., assignor to Bomac Laboratories Inc., Beverly, Mass., a corporation of Massachusetts Application April 9, 1956, Serial No. 577,025
3 Claims. (Cl. 315—39.61)

The present invention relates to electron discharge devices of the multicavity magnetron type and more particularly to novel structure for tuning such devices over a selected band of microwave frequencies.

Mechanical structures for tuning prior art magnetrons fall into two broad categories, namely inductive or capacitive tuning. The theory and explanation of these tuning systems has been adequately described in the text "Microwave Magnetrons," vol. 6, Radiation Laboratory Series, McGraw-Hill Book Co. Inc., New York, 1948, at pages 561 to 575. In all prior art structures, the supporting means for the tuning member is generally positioned at a distance from the critical area where the tuning member enters the multicavity anode element. This cantilever arrangement results in considerable difficulty in accurate positioning of the tuning member whether it comprises a rod, pin or a ring to prevent direct shorting to the anode cavity walls. Further, it is customary to enclose the tuning support means within the deformable bellows which is hermetically sealed from the remaining structure. Since magnetrons are evacuated devices, the internal atmosphere of the bellows, however, remains at normal atmospheric pressures. Consequently problems of oxidation arise and it is necessary to supply satisfactory lubricants for the moving components.

The aforementioned difficulties become acute in magnetrons designed for higher frequencies of operation where for example each cavity of a 22 cavity anode has a width in the order of 70 mils and a tuning member of the order of 45 mils must be inserted into each cavity. Because of these critical spacings, tunable magnetrons in some very high frequency bands have been nonexistent.

Accordingly, it is an object of the present invention to provide in a magnetron device, novel tuning structure which is particularly adapted to accurately position a tuning member in embodiments where critical tolerances must be maintained.

A further object is to provide a novel tuning structure for a magnetron device in which the main tuning member support is much closer to the critical region to thereby avoid the cantilever effect of prior art structures.

A still further object is to provide a novel tuning structure for a magnetron wherein the main support bearing is housed within a vacuum to thereby eliminate oxidation and lubrication problems inherent in prior art structures.

Briefly, in the specific illustrative embodiment of the invention a tuning bearing is provided to which the tuning member is permanently secured. Both of these members are then secured to the tuning carrier which is the only component housed within the bellows. A novel inner pole piece arrangement extends axially within the bearing assembly and is secured to surrounding structure by means of a pin. The tuning bearing is provided with a slot through which the pin extends so that movement of the tuning member may be facilitated while the inner pole piece remains fixed. The resultant structure supports the movable tuning member in the area adjacent to the anode which will be evacuated when the magnetron is exhausted to the high degree of vacuum necessary for such devices.

Other features, objects and advantages of the invention will be evident after consideration of the following detailed description and appended drawings in which.

Figures 1A, 3:
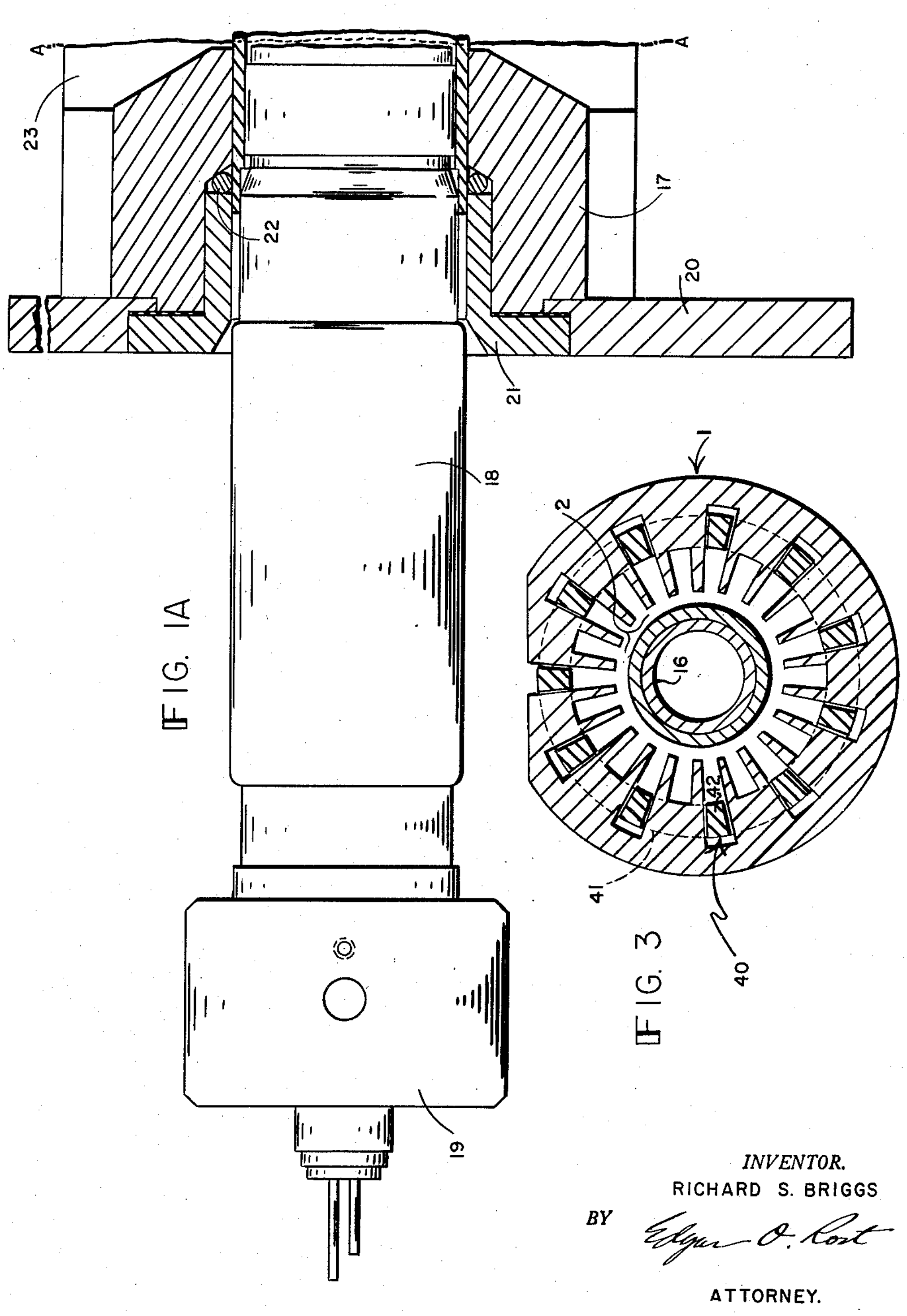
Figure 1A is a detailed cross-sectional view of a portion of the embodiment up to the line A—A.
Figure 3 is a cross-sectional view taken along the line 3—3 in Figure 1B showing the respective position of the tuning pins inserted in the anode cavities.
Figure 1B:
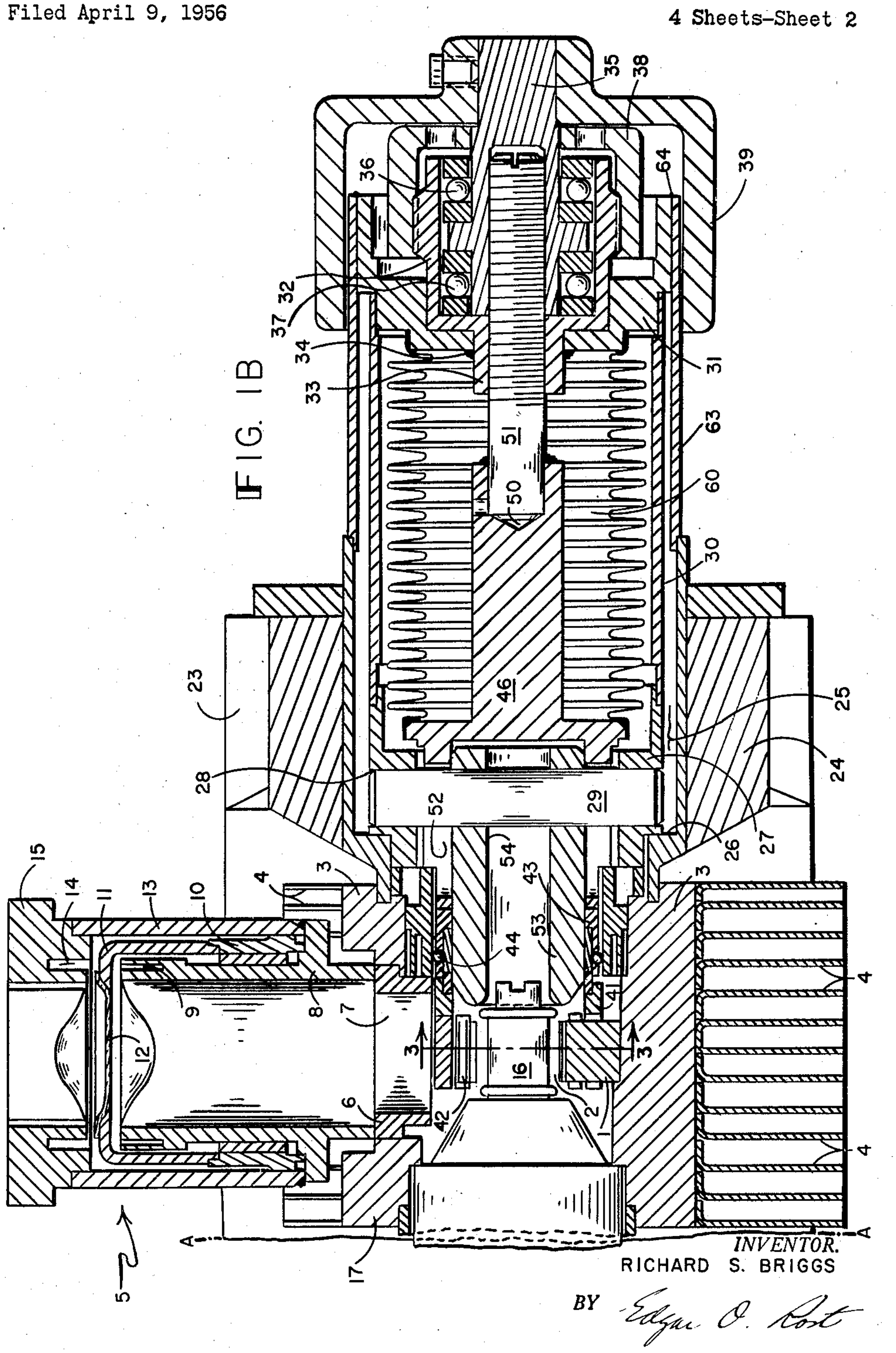
Figure 1B is a detailed cross-sectional view of the tuning end and main body portion of the embodiment from the line A—A.

Referring now to Figures 1A and 1B the specific illustrative embodiment comprises a so-called "rising-sun" anode 1 having a plurality of wedge-shaped cavities in circular array around an axial bore 2 and is brazed into a metallic anode ring 3. Heat radiating vanes 4 are secured to anode ring 3 and extend substantially three-quarters of the way around ring 3. Power is coupled from the magnetron by means of a waveguide output assembly 5 hermetically sealed to anode ring 3 by means of a transformer ring 6 which communicates with the anode by means of a slit 7 in waveguide transformer 8. Choke 9 is provided at the outer-end of transformer 8 in the manner well known in the art. An inner window base member 10 encircles transformer 8 and has hermetically sealed thereto window cup 11 provided with window 12 to permit passage of electronmagnetic energy. Output coupler 13 surrounds the transformer and window assembly and is provided with a choke 14 and waveguide flange 15 to connect the magnetron to external waveguide structure.

Cathode assembly 16 extends into the anode axial bore 2 through the axial passage formed in first pole piece 17 which is hermetically sealed to one end of anode ring 3. The supporting cylinder 18 encloses a cathode heater and terminal leads of well-known construction with a centering mechanism 19 disposed at the outer end. Mounting plate 20 is secured to pole piece by means of a ring 21 and pressure gasket 22. Two U-shaped magnets 23 are provided which are mounted on the pole pieces.

Figure 2:
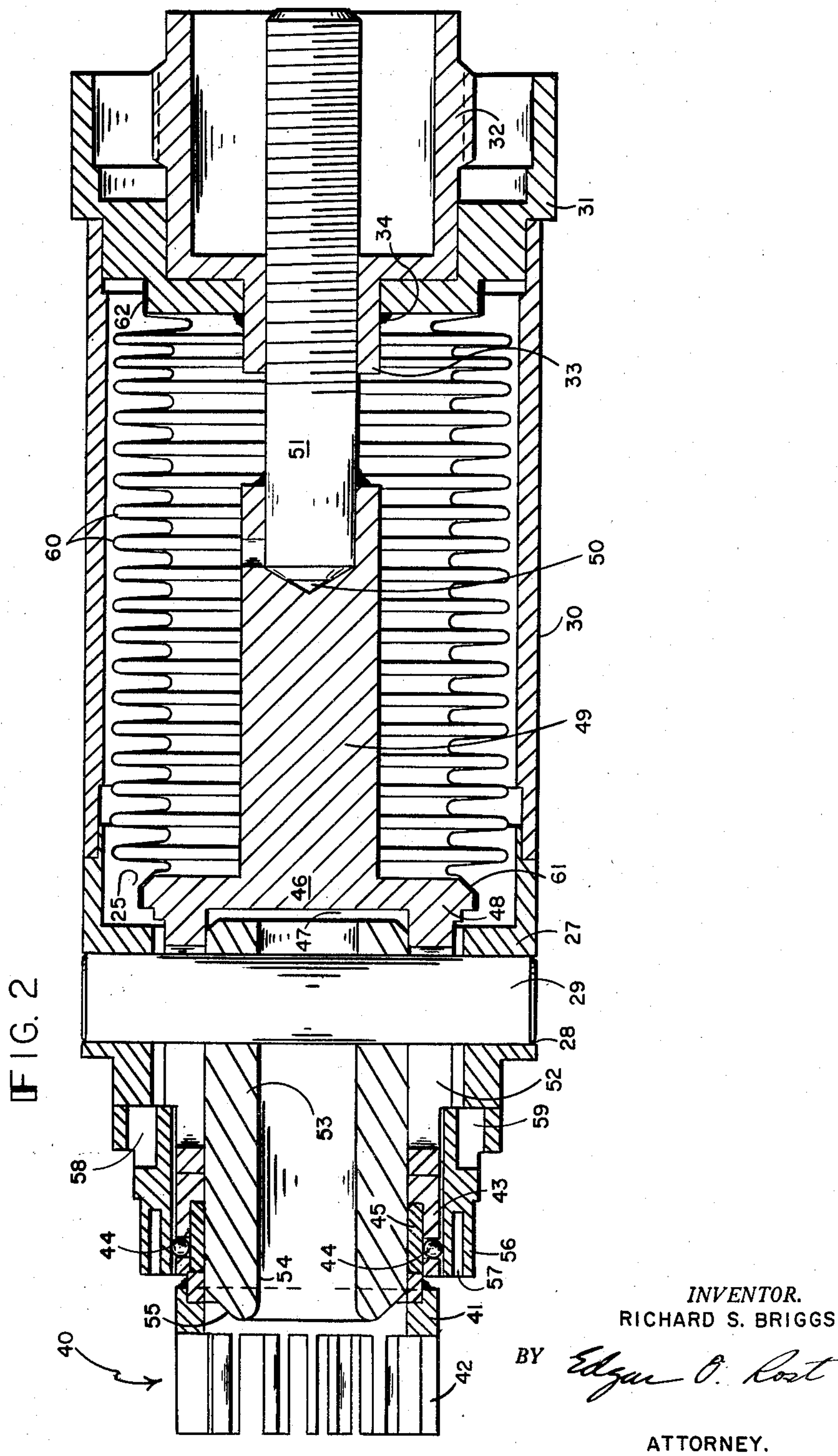
Figure 2 is an enlarged detailed view of the tuning structure of the embodiment.

Second pole piece 24 having an axial passageway 25 is hermetically sealed to the other end of anode ring 3. The complete tuning assembly as shown in Figure 2 is positioned within passageway 25 and comprises a cylindrical collar 27, having a transverse aperture 28 for insertion of locking pin 29. An inner metallic cylinder 30 is hermetically sealed to collar 27 at one end and in turn supports tuning end cover 31 having a central aperture therein. Bearing housing 32 having a central hub portion 33 extends through the central aperture and is hermetically sealed at 34 to end cover 31. To provide the rotary motion of the tuning assembly internally threaded bearing shaft 35 with two ball bearings 36 and 37 is positioned within the bearing housing and retained by means of nut 38. Tuning knob 39 is then secured to shaft 35.

The illustrative embodiment is tuned by the inductive method which comprises the insertion of a conductive element such as a rod, pin or vane into the anode cavities to tune to the highest frequencies. Removal of the tuning element will cause the magnetron frequency to decrease. In the selected magnetron, a tuning element 40 comprising a crown 41 with a plurality of vanes 42 having a configuration similar to the anode cavities is axially displaced to tune the tube. The novel features of the present invention which provide for support of the tuning element in close proximity to the anode will now be described.

The tuning crown 41 is hermetically sealed to a ring bearing member 43 having a plurality of spaced spherical members 44 positioned therein. In the preferred embodiment sapphires were selected, however any suitable hardening bearing material may be employed. Since most magnetron components are fabricated from copper to facilitate furnace brazing sealing techniques it is desirable to substitute a substantially harder metal for a bearing surface within ring member 43. For this reason a ring insert 45 may be provided of a metal such as molybdenum as one of the surfaces in contact with the sapphire bearing 44. The main tuning carrier member 46 is then hermetically joined to ring bearing member 43. Carrier member 46 is provided with a central hollow re-entrant portion 47 and terminates in a substantially T-shaped section. This section has an end wall 48 and a reduced shank 49 having an aperture 50 to receive shaft 51 which in turn is in threaded engagement with the rotatable bearing shaft 35 of the mechanism previously described. A transverse slot 52 is provided in the re-entrant portion 47 and the desired length of travel of the tuning element 40 determines the longitudinal dimension of this slot. Cylindrical inner pole piece member 53 having a central aperture 54 and chamfered nose portion 55 is positioned within the hollow portion 47 of carrier 46. A transverse aperture in this inner pole piece member provides means for introduction of locking pin 29 which is in turn anchored within aperture 28 in collar 27. This arrangement maintains the relative position of member 53 with respect to the anode 1 while ring bearing member 43 activated by the carrier 46 moves axially. Member 53 is fabricated from any of the magnetic metals and provides for the introduction of a concentrated component of the magnet circuit in closer proximity to the anode in a manner considered to be novel in the magnetron art. Bushing 56 with a channel shaped choke 57 is secured to collar 27 to provide the main bearing surface in contact with spherical bearings 44. Two opposed screw holes 58 and 59 are provided to prevent any entrapment of air during evacuation of the magnetron.

A conventional Sylphon bellows 60 of a deformable metal is hermetically sealed at one end to the chamfered edge of the end wall 48 of tuning carrier member 46 as at 61 and at the other end to end cover 31 as at 62. This results in an internal atmosphere at normal atmospheric pressure while the remainder of the magnetron is evacuated.

In the method of fabricating magnetrons of the type described the complete tuning assembly as shown in Figure 2 is pre-assembled and adjusted. This assembly is then inserted into an outer cylindrical barrel 63 which has been previously brazed to pole piece 24 and the contacting surface of end cover 31 is brazed to the barrel 63 as at 64. Collar 27 of the tuning assembly will be secured to shoulder 26 in pole piece 24 at the inner end. The rotatable components of the tuning mechanism may then be inserted in bearing housing 32 and knob 39 secured.

Figure 3 shows the positioning of the tuning vanes of the specific embodiment in relation to the anode cavities. Each vane has a dimension of .046 inch along the broadest dimension and the widest cavity dimension is .074 inch. This results in a clearance of only approximately .014 inch on each side. Inasmuch as the main support for the tuning vanes 42 is the ring bearing member 43 with sapphire bearings 44 contacting choke bushing 56 as well as pole piece insert 53, it will be evident that more accurate alignment is possible. Furthermore, since the main support for the tuning element is now within the region evacuated instead of being enclosed within bellows 60, problems of lubrication and oxidation are virtually eliminated.

Figure 4:
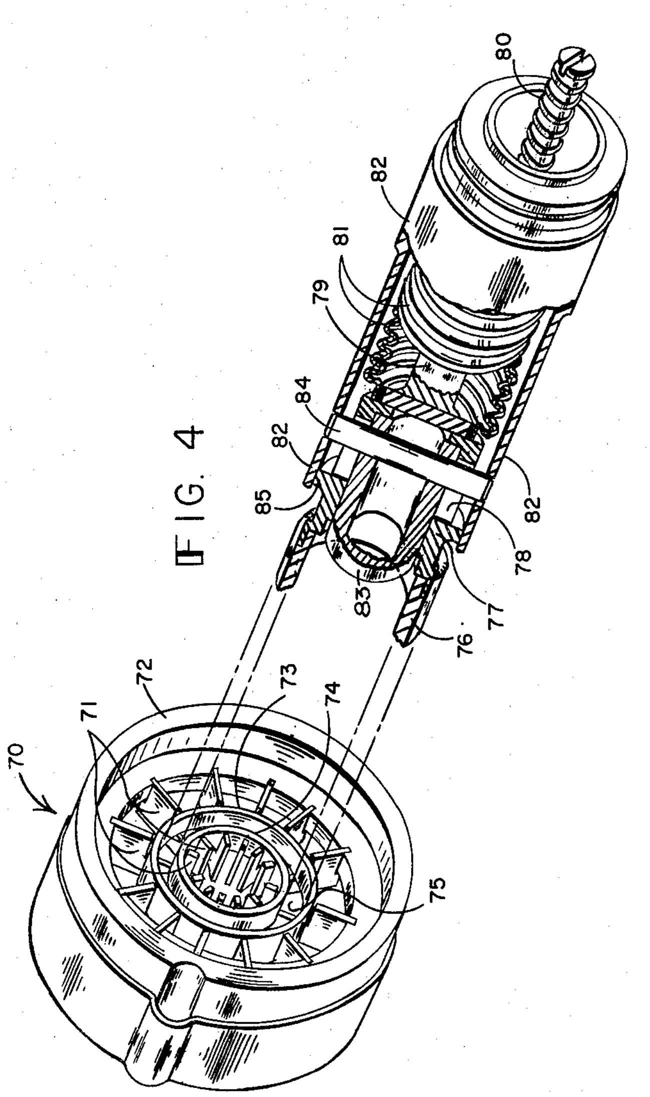
Figure 4 is a perspective view partially in section illustrative of a modification of the invention employed in a capacitive tuning arrangement of the "cookie-cutter" type.

To illustrate the adaptability of the invention to other methods of tuning reference is now made to Figure 4 which shows the so-called "cookie-cutter" type of capacitive tuning. The specific anode 70 comprises a plurality of vanes 71 joined to outer ring 72 with a circular strap 73 sealed to alternate vanes. A second strap 74 of reduced diameter is joined to the remaining vanes to define therebetween a capacitive gap 75. Tuning is accomplished by means of a metal tuning ring 76 inserted between the straps to thereby alter the capacitance.

The tuning member shown incorporates the same features as the previously described embodiment. In order to facilitate the understanding of this modification, other structure of the capacitive-tuned magnetron has been omitted because it has been adequately described in the prior art. The tuning sub-assembly shown may be completed independently of the remaining tube structure and then be inserted and sealed.

In this embodiment tuning ring 76 is secured to a tuning carrier member 77 having a slot 78. Shaft 79 is sealed to carrier member 77 and is provided with threads 80 for connection to the external rotatable tuning mechanism. Bellows 81 is sealed at one end to carrier member 77 and the other end is simply secured to the inner walls of cylinder 82. The movable elements extend axially within cylinder 82 with the transverse locking pin 84 limiting the distance of travel. The magnetic pole piece 83 remains stationary within the cylindrical passage and the carrier member 77 contacts the inner walls of cylinder 82 by means of a step 85.

As in the previous embodiment the main bearing surfaces are enclosed within the evacuated portion of the device. Further the support of the tuning member in close proximity to the anode member provides mechanical advantages over prior art supporting structures.

While several specific embodiments have been described, numerous modifications and alterations may occur to those skilled in the art. It is my intention to cover in the appended claims all such modifications or alterations as fall within the spirit and scope of the invention.

What I claim is:

1. A tunable magnetron comprising an anode structure defining a plurality of cavities, a cathode centrally positioned within said anode structure and a tuning assembly positioned adjacent said anode structure, said tuning assembly comprising a plurality of tuning members adapted to be inserted and removed from each of said anode cavities, a bearing member secured to said tuning members, said bearing member having a plurality of spherical members disposed on its outer surface, a carrier member secured to said bearing member having a hollow re-entrant portion defined therein with a transverse slot extending therethrough, a cylindrical member enclosing said bearing and carrier member with a bushing member disposed at one end, a cylinder of a magnetic metal positioned within said hollow portion and a locking member extending transversely through said magnetic cylinder and transverse slot with the ends thereof being anchored to said cylindrical member to thereby maintain said magnetic cylinder in a fixed position relative to said anode structure, the inside surfaces of said bearing and carrier member being in slidable contact with said magnetic cylinder while the spherical members of said bearing member contact said bushing member to thereby provide rigid support of said tuning members in close proximity to their point of introduction into said anode cavities.

2. A tunable magnetron comprising an evacuated envelope including an anode member with first and second oppositely disposed magnetic pole pieces attached thereto, said anode member defining a plurality of cavity resonators disposed around a central aperture, a cathode positioned within said central aperture, cathode supporting structure extending within said first pole piece, an integral tuning assembly positioned within said second pole piece, said tuning assembly comprising a plurality of tuning members adapted to be positioned within each of said cavity resonators, means for axially moving said tuning members secured thereto and including a bearing support member and a carrier member, said carrier member having a hollow re-entrant portion with a transverse slot therein having a length equivalent to the desired distance of axial displacement of said tuning members, an inner magnetic pole piece member positioned within said hollow portion, a cylindrical member surrounding said bearing support and carrier member with a bushing member at one end thereof, said bushing member having a channel-shaped choke defined therein, a locking pin extending transversely through said inner pole piece member and carrier member slot with the ends thereof securely anchored to said cylindrical member to thereby maintain said inner pole piece member in fixed relationship to said anode structure, said bearing support member slidably contacting said bushing member and inner pole piece member throughout the total distance of movement to thereby prevent any lateral displacement of said tuning members within said anode cavities.

3. A tunable magnetron comprising an evacuated envelope including an anode member with first and second oppositely disposed magnetic pole pieces attached thereto, said anode member defining a plurality of cavity resonators disposed around a central aperture, a cathode positioned within said central aperture, cathode supporting structure extending within said first pole piece, an integral tuning assembly positioned within said second pole piece, said tuning assembly comprising a plurality of tuning members adapted to be positioned within each of said cavity resonators, means for axially moving said tuning members secured thereto and including a bearing support member and a carrier member, said carrier member having a hollow reentrant portion with a transverse slot therein, an inner magnetic pole piece member positioned within said hollow portion, a cylindrical member surrounding said bearing support and carrier members with a bushing member at one end thereof, said bushing member having a channel-shaped choke defined therein, a locking pin extending transversely through said inner pole piece member and carried member slot with the ends thereof securely anchored to said cylindrical member to thereby maintain said inner pole piece member in fixed relationship to said anode structure, said bearing support member slidably contacting said bushing member and inner pole piece member throughout the total distance of movement to thereby prevent any lateral displacement of said tuning members within said anode cavities.

References Cited in the file of this patent

UNITED STATES PATENTS

| | | |
|---|---|---|
| 2,559,506 | Kurshan | July 31, 1951 |
| 2,704,337 | La Rue | Mar. 15, 1955 |
| 2,704,338 | Clampitt | Mar. 15, 1955 |